(12) United States Patent
Guarini et al.

(10) Patent No.: US 6,830,962 B1
(45) Date of Patent: Dec. 14, 2004

(54) SELF-ALIGNED SOI WITH DIFFERENT CRYSTAL ORIENTATION USING WAFER BONDING AND SIMOX PROCESSES

(75) Inventors: Kathryn W. Guarini, Yorktown Heights, NY (US); Meikei Ieong, Wappingers Falls, NY (US); Leathen Shi, Yorktown Heights, NY (US); Min Yang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/634,446

(22) Filed: Aug. 5, 2003

(51) Int. Cl.[7] ............................................... H01L 21/00
(52) U.S. Cl. ...................... 438/149; 438/150; 438/154; 438/155
(58) Field of Search ................................ 438/149, 150, 438/152–156, 164, 282, 298, 309, 311, 412, 910; 257/347–354

(56) References Cited

U.S. PATENT DOCUMENTS 5,173,446 A * 12/1992 Asakawa et al. ........... 438/412
5,572,771 A    11/1996 Kelleghan .................... 24/170
5,610,083 A *  3/1997 Chan et al. .................. 438/155

OTHER PUBLICATIONS

Bison Designs, On–Line Store, Hydro Clip, water bottle holder sold by applicant/owner before Aug. 2002.
Bison Designs, On–Line Store, Bottle Bandit, water bottle holder sold by applicant/owner before Aug. 2002.

* cited by examiner

*Primary Examiner*—Hung Vu
(74) *Attorney, Agent, or Firm*—Scully, Scott, Murphy & Presser; Wan Yee Cheung, Esq.

(57) ABSTRACT

The present invention provides integrated semiconductor devices that are formed upon an SOI substrate having different crystal orientations that provide optimal performance for a specific device. Specifically, an integrated semiconductor structure including at least an SOI substrate having a top semiconductor layer of a first crystallographic orientation and a semiconductor material of a second crystallographic orientation, wherein the semiconductor material is substantially coplanar and of substantially the same thickness as that of the top semiconductor layer and the first crystallographic orientation is different from the second crystallographic orientation is provided. The SOI substrate is formed by wafer bonding, ion implantation and annealing.

17 Claims, 5 Drawing Sheets

SELF-ALIGNED SOI WITH DIFFERENT CRYSTAL ORIENTATION USING WAFER BONDING AND SIMOX PROCESSES

RELATED APPLICATIONS

This application is related to co-pending and co-assigned U.S. patent application Ser. No. 10/250,241, filed Jun. 17, 2003, the entire content of which is incorporated herein by reference.

FIELD OF THE INVENTION

The present invention relates to high-performance metal oxide semiconductor field effect transistors (MOSFETs) for digital or analog applications, and more particularly to MOSFETs utilizing carrier mobility enhancement from substrate surface orientation.

BACKGROUND OF THE INVENTION

In present semiconductor technology, complementary metal oxide semiconductor (CMOS) devices, such as nFETs (i.e., n-channel MOSFETs) or pFETs (i.e., p-channel MOSFETs), are typically fabricated upon semiconductor wafers, such as Si, that have a single crystal orientation. In particular, most of today's semiconductor devices are built upon Si having a (100) crystal orientation.

Electrons are known to have a high mobility for a (100) Si surface orientation, but holes are known to have high mobility for a (110) surface orientation. That is, hole mobility values on (100) Si are roughly 2x–4x lower than the corresponding electron hole mobility for this crystallographic orientation. To compensate for this discrepancy, pFETs are typically designed with larger widths in order to balance pull-up currents against the nFET pull-down currents and achieve uniform circuit switching. pFETs having larger widths are undesirable since they take up a significant amount of chip area.

On the other hand, hole mobilities on (110) Si are 2x higher than on (100) Si; therefore, pFETs formed on a (110) surface will exhibit significantly higher drive currents than pFETs formed on a (100) surface. Unfortunately, electron mobilities on (110) Si surfaces are significantly degraded compared to (100) Si surfaces.

As can be deduced from the above, the (110) Si surface is optimal for pFET devices because of excellent hole mobility, yet such a crystal orientation is completely inappropriate for nFET devices. Instead, the (100) Si surface is optimal for nFET devices since that crystal orientation favors electron mobility.

In view of the above, there is a need for providing integrated semiconductor devices that are formed upon a substrate having different crystal orientations that provide optimal performance for a specific device. A need also exists to provide a method to form such an integrated semiconductor device in which both the nFETs and the pFETs are formed on a silicon-on-insulator substrate having different crystallographic orientations in which the semiconducting layers that the devices are built upon are substantially coplanar and have substantially the same thickness.

SUMMARY OF THE INVENTION

One object of the present invention is to provide a method of fabricating integrated semiconductor devices such that different types of CMOS devices are formed upon a specific crystal orientation of a silicon-on-insulator (SOI) substrate that enhances the performance of each device.

Another object of the present invention is to provide a method of fabricating integrated semiconductor devices such that the pFETs are located on a (110) crystallographic plane, while the nFETs are located on a (100) crystallographic plane of the same SOI substrate.

A further object of the present invention is to provide a method of integrating SOI technology with CMOS technology using simple and easy processing steps.

A still further object of the present invention is to provide a method of forming an integrated semiconductor structure in which both CMOS devices, i.e., pFETs and nFETs, are SOI like.

A yet further object of the present invention is to provide a method of forming an integrated semiconductor structure comprising an SOI substrate having different crystal orientations in which the semiconducting layers that the devices are built upon are substantially coplanar and have substantially the same thickness.

These and other objects and advantages are achieved in the present invention by utilizing a method that includes wafer bonding, etching, regrowth of a semiconductor layer in the etched area and ion implanting and annealing, e.g., SIMOX (separation by implanted oxygen). Specifically, the method of the present invention first includes providing an SOI substrate that includes at least a top semiconductor layer and a bottom semiconductor layer of different crystallographic orientations. The SOI substrate is provided by bonding two different semiconductor wafers together. After bonding, an opening that exposes a surface of the bottom semiconductor layer of the SOI substrate is formed utilizing a selective etching process.

Next, a semiconductor material having the same crystallographic orientation as that of the bottom semiconductor layer is epitaxially grown in the opening on the exposed surface of the bottom semiconductor layer. Spacers may be formed on the exposed sidewalls of the opening prior to forming the semiconductor material. A SIMOX like process (including ion implantation of oxygen or nitrogen and annealing) is used to form a buried insulating region within the semiconductor material.

Following the implanting and annealing, a planarization step is employed to provide a structure in which the semiconductor material having the second crystallographic orientation is substantially coplanar and of substantially the same thickness as that of the top semiconductor layer. At least one nFET and at least one pFET may then be formed on either the top semiconductor layer or the semiconductor material depending on the surface orientation of that layer. Both CMOS devices, i.e., the nFET and the pFET are SOI like devices since that are formed in a SOI layer, i.e., the top semiconductor layer or the regrown semiconductor material, that is separated from the bottom semiconductor layer by a buried insulating layer.

DETAILED DESCRIPTION OF THE INVENTION

Figure 1:
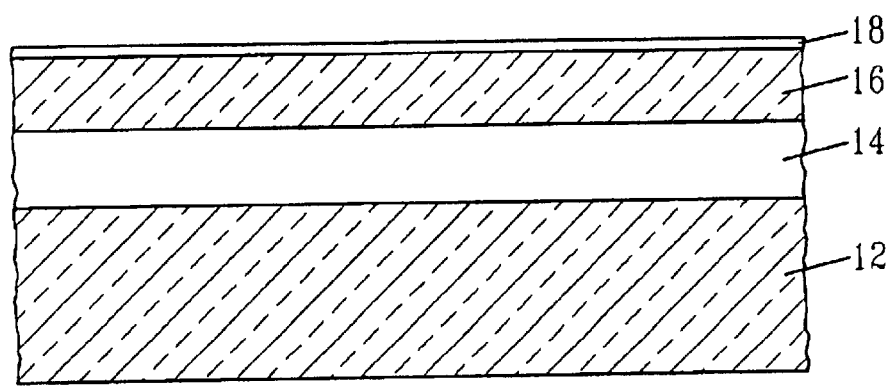
FIG. 1 is a pictorial representation (through a cross sectional view) illustrating an initial SOI substrate having semiconductor layers of different crystallographic orientations.

The present invention which provides a method of forming an SOI structure with different crystal orientations using wafer bonding and ion implanting and annealing, will now be described in greater detail by referring to the drawings that accompany the present application. In the accompanying drawings, like and corresponding elements are referred to by like reference numerals.

Referring to FIG. 1, there is shown an initial bonded SOI substrate 10 which may be employed in the present invention. As shown, bonded SOI substrate 10 includes a surface dielectric layer 18, a top semiconductor layer 16, an insulating layer 14, and a bottom semiconductor layer 12. The bonded substrate 10 may further include an optional semiconductor layer (not shown) that is located beneath the bottom semiconductor layer 12. In the optional bonded substrate, another insulating layer separates the bottom semiconductor layer 12 from the optional semiconductor layer.

The surface dielectric layer 18 of the bonded substrate 10 is an oxide, nitride, oxynitride or other insulating layer that is either present in one of the initial wafers before bonding, or formed atop the top semiconductor layer 16 after wafer bonding by either a thermal process (i.e., oxidation, nitridation or oxynitridation) or by deposition. Notwithstanding the origin of the surface dielectric layer 18, the surface dielectric layer 18 has a thickness of from about 3 to about 500 nm, with a thickness of from about 5 to about 20 nm being more highly preferred.

The top semiconductor layer 16 is comprised of any semiconducting material including, for example, Si, SiC, SiGe, SiGeC, Ge alloys, GaAs, InAs, InP as well as other III/V or II/VI compound semiconductors. Top semiconductor layer 16 may also comprise an SOI layer of a preformed SOI substrate or a layered semiconductor such as, for example, Si/SiGe. The top semiconductor layer 16 is also characterized as having a first crystallographic orientation, which is preferably (110). Although a (110) crystal orientation is preferred, the top semiconductor layer 16 may have a (111), or a (100) crystal orientation.

The thickness of the top semiconductor layer 16 may vary depending on the initial starting wafers used to form the bonded substrate 10. Typically, however, the top semiconductor layer 16 has a thickness of from about 5 to about 500 nm, with a thickness of from about 5 to about 100 nm being more highly preferred.

The insulating layer 14 which is located between the top semiconductor layer 16 and the bottom semiconductor layer 12 has a variable thickness depending upon the initial wafers used to create the bonded substrate 10. Typically, however, the insulating layer 14 has a thickness of from about 1 to about 500 nm, with a thickness of from about 5 to about 100 nm being more highly preferred. The insulating layer 14 is an oxide or other like insulator material that is formed on one or both of the wafers prior to bonding.

The bottom semiconductor layer 12 is comprised of any semiconducting material which may be the same or different from that of the top semiconductor layer 16. Thus, bottom semiconductor layer 12 may include, for example, Si, SiC, SiGe, SiGeC, Ge alloys, GaAs, InAs, InP as well as other III/V or II/VI compound semiconductors. Bottom semiconductor layer 12 may also comprise an SOI layer of a preformed SOI substrate or a layered semiconductor such as, for example, Si/SiGe. The bottom semiconductor layer 12 is also characterized as having a second crystallographic orientation, which is different from the first crystallographic orientation of the top semiconductor layer 16. Since the top semiconductor layer 16 is preferably a (110) surface, the crystallographic orientation of the bottom semiconductor layer 12 is preferably (100). Although a (100) crystal orientation is preferred, the bottom semiconductor layer 12 may have a (111), or a (110) crystal structure depending on the crystal orientation of the top semiconductor layer 16.

The thickness of the bottom semiconductor layer 12 may vary depending on the initial starting wafers used to form the bonded substrate 10. In embodiments in which there is no optional semiconductor layer beneath the bottom semiconductor layer 12, the bottom semiconductor layer 12 serves as a handle wafer for the whole structure. To support the whole wafer, the thickness of the bottom semiconductor layer 12 is hundreds of $\mu$m thick. For example, the thickness of the bottom semiconductor layer 12 may be from about 500 to about 800 $\mu$m. In embodiments in which there is an optional semiconductor layer beneath the bottom semiconductor layer 12, the bottom semiconductor layer 12 may have a thickness of from about 5 nm to about 200 $\mu$m, with a thickness of from about 5 to about 100 nm being more highly preferred.

When an optional semiconductor layer is present beneath the bottom semiconductor layer 12, the optional semiconductor layer may comprise the same or different semiconducting material as that of the bottom semiconductor layer 12. The crystal orientation of the optional semiconductor layer is typically, but not always, the same as the bottom semiconductor layer. The optional semiconductor layer is generally thicker than the bottom semiconductor layer 12. When the optional semiconductor layer is present, an insulating layer separates the optional semiconductor layer from the bottom semiconductor layer.

The bonded substrate 10 illustrated in FIG. 1 is comprised of two semiconductor wafers that are bonded together. The two wafers used in fabricating the bonded substrate 10 may include two SOI wafers, wherein one of the wafers includes the top semiconductor layer 16 and the other wafer includes the bottom semiconductor layer 12; an SOI wafer and a bulk semiconductor wafer; two bulk semiconductor wafers in which at least one of the wafers contains an insulating layer 14 thereon; or an SOI wafer and a bulk wafer which includes an ion implant region, such as a $H_2$ implant region, which can be used to split a portion of at least one of the wafers during bonding. The present invention also contemplates the use of two bulk wafers where one of the wafers has $H_2$ implanted therein.

Bonding is achieved by first bringing the two wafers into intimate contact with other; optionally applying an external force to the contacted wafers; and then heating the two contacted wafers under conditions that are capable of bonding the two wafers together. The heating step may be performed in the presence or absence of an external force. The heating step is typically performed in an inert ambient at a temperature of from about 600° to about 1300° C. for a time period of from about 2 to about 20 hours. More preferably, the bonding is performed at a temperature of from about 900° to about 1200° C. for a time period of from about 2 to about 20 hours. The term "inert ambient" is used in the present invention to denote an atmosphere in which an inert gas, such as He, Ar, $N_2$, Xe, Kr or a mixture thereof, is employed. A preferred ambient used during the bonding process is $N_2$. In embodiments in which hydrogen implantation is used, an initial heating step that is performed at a temperature of from about 200° to about 500° C. may be employed prior to bonding.

In the embodiment where two SOI wafers are employed, some material layers of at least one of the SOI wafers may be removed after bonding utilizing a planarization process such as chemical mechanical polishing (CMP) or grinding and etching. The planarization process stops when surface dielectric layer 18 is reached.

In the embodiment in which one of the wafers includes an ion implant region, the ion implant region forms a porous region during bonding which causes a portion of the wafer above the ion implant region to break off leaving a bonded wafer such as is shown, for example, in FIG. 1. The implant region is typically comprised of hydrogen ions which are implanted into the surface of the wafer utilizing ion implantation conditions that are well known to those skilled in the art.

In the embodiment where the wafers to be bonded do not include a dielectric layer therein, the surface dielectric layer 18 may be formed atop the bonded wafers by a thermal process, such as oxidation, or by a conventional deposition process such as chemical vapor deposition (CVD), plasma-enhanced CVD, atomic layer deposition, chemical solution deposition as well as other like deposition processes.

A patterned mask 20 is then formed on a predetermined portion of the bonded substrate 10 of FIG. 1 so as to protect a portion of the bonded substrate 10, while leaving at least one other portion of the bonded substrate 10 unprotected. The protected portions of the bonded substrate 10 define a first device region of the structure, whereas the unprotected portions of the bonded substrate 10 define a second device area. The patterned mask 20 is a nitride or oxynitride layer that is formed and patterned utilizing lithography and etching.

The patterned mask 20 is used in the present invention to block oxidation of the protected portion of the bonded SOI substrate during the implanting and annealing step. To achieve substantially the same SOI thickness in the final structure, one may choose the thickness of this masking layer to be substantially equal to the oxidized portion of the regrown semiconductor layer formed in FIG. 6 subtracting the thickness of the surface dielectric layer 18. The surface dielectric 18 may serve as an etch stop layer during subsequent removal of patterned mask 20.

Figure 2:
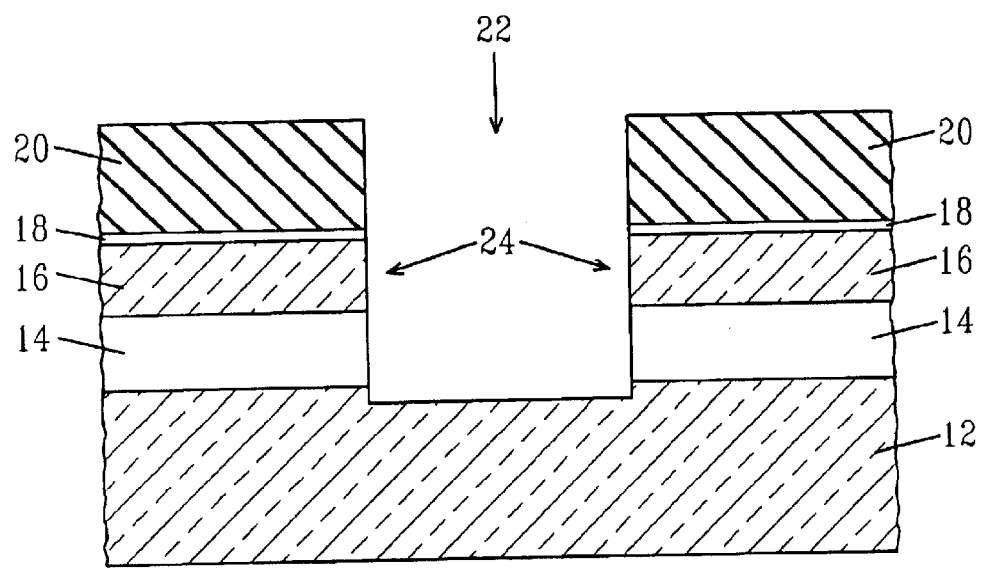
FIG. 2 is a pictorial representation (through a cross sectional view) illustrating an opening formed in the SOI substrate of FIG. 1 so as to expose a portion of the bottom semiconductor layer.

After providing the patterned mask 20 to the bonded substrate 10, the structure is subjected to one or more etching steps so as to provide at least one opening 22 that exposes a surface of the second semiconductor layer 12. The resultant structure formed after formation of the patterned mask 20 and etching is shown, for example, in FIG. 2. Specifically, the one or more etching steps used at this point of the present invention removes the unprotected portions of the surface dielectric layer 18, as well as underlying portions of the top semiconductor layer 16, and a portion of the insulating layer 14 which separated the top semiconductor layer 16 from the bottom semiconductor layer 12.

The etching may be performed utilizing a single etching process or multiple etching steps may be employed. The etching used at this point of the present invention may include a dry etching process such as reactive-ion etching, ion beam etching, plasma etching or laser etching, a wet etching process wherein a chemical etchant is employed or any combination thereof. The etching may stop on the upper surface of the bottom semiconductor layer 12 or it may stop at a region slightly below the upper surface of the bottom semiconductor layer 12. In a preferred embodiment of the present invention, reactive-ion etching (RIE) is used in selectively removing the unprotected portions of the surface dielectric layer 18, the top semiconductor layer 16 and the insulating layer 14.

Note that the opening 22 has exposed sidewalls 24 after etching which include the remaining surface dielectric layer 18, the remaining top semiconductor layer 16, the remaining insulating layer 14 as well as the remaining bottom semiconductor layer 12. As shown, the exposed sidewalls of layers 18, 16 and 14 are aligned with an outer most edge of mask 20.

Figure 3:
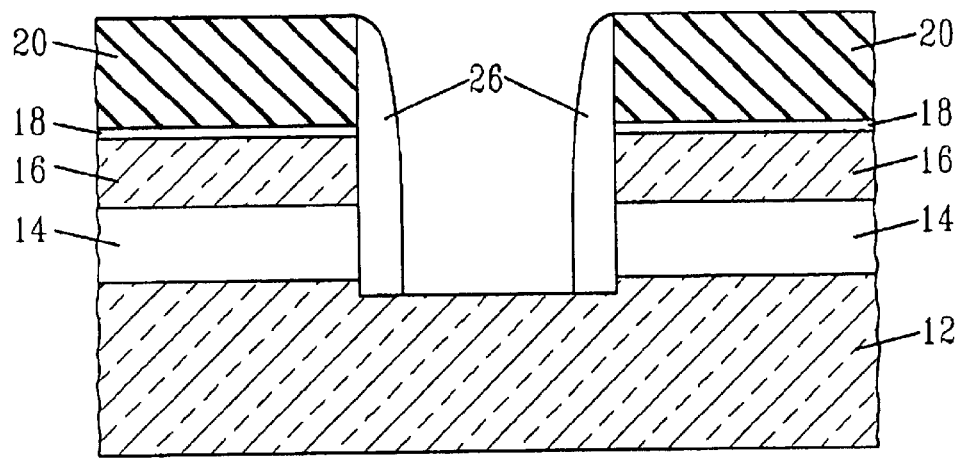
FIG. 3 is a pictorial representation (through a cross sectional view) illustrating the structure of FIG. 2 containing a spacer on each exposed sidewall of the opening.

With patterned mask 20 in place, a spacer 26 is formed on the exposed sidewalls 24 in the at least one opening 22 providing the structure shown, for example, in FIG. 3. The spacer 26, which is formed by deposition and etching, is comprised of an insulating material such as, for example, an oxide. The spacer 26 is used in the present invention as a selective epitaxy block mask to block epitaxy from the top semiconductor layer 16 exposed on the etched sidewall to ensure high-quality single grain crystals in the etched area after epitaxy.

Figure 4:
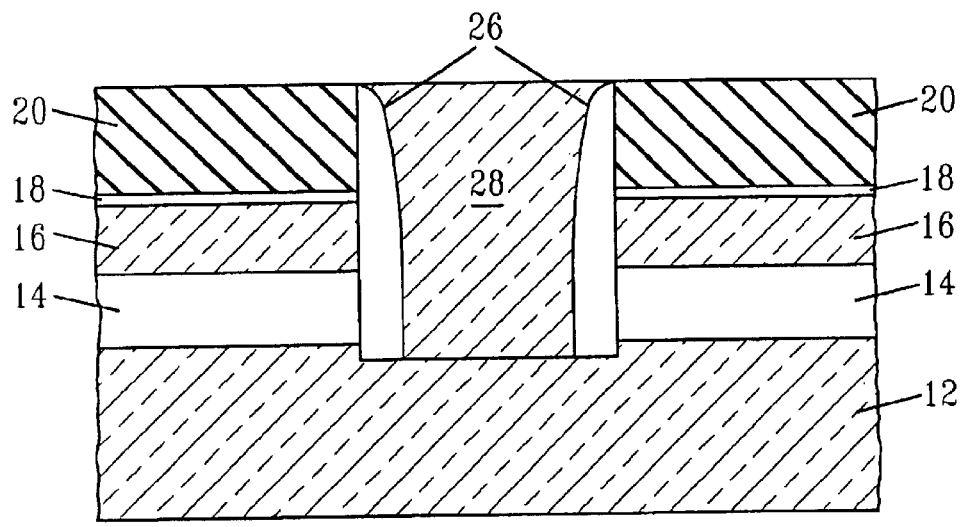
FIG. 4 is a pictorial representation (through a cross sectional view) illustrating the structure after a semiconductor material is formed on the exposed surface of the bottom semiconductor layer of FIG. 3.

After forming the spacer 26, a semiconductor material 28 is formed selectively on the exposed surface of the bottom semiconductor layer 12 providing the structure shown, for example, in FIG. 4. In accordance with the present invention, semiconductor material 28 has a crystallographic orientation that is the same as the crystallographic orientation of the bottom semiconductor layer 12.

The semiconductor material 28 may comprise any Si-containing semiconductor, such as Si, strained Si, SiGe, SiC, SiGeC or combinations thereof, which is capable of being formed utilizing a selective epitaxial growth method. In some preferred embodiments, semiconductor material 28 is comprised of Si. In the present invention, semiconductor material 28 may be referred to as a regrown semiconductor material. The semiconductor material 28 formed by the epitaxy process may be grown higher than the upper surface of the patterned mask 20 and then polished back to the upper surface of the patterned mask 20 to remove any possible facet growth. Note that the semiconductor material 28 may be different from the bottom semiconductor material 12. Thus, for example, a SiGe alloy may be grown on a Si layer. In the drawings, the semiconductor material 28 and the semiconductor layer 12 are comprised of the same semiconducting material as evident by the absence of a true interface existing between these materials. If the materials were dissimilar, an interface would be present between semiconductor material 28 and the bottom semiconductor layer 12.

Figure 5:
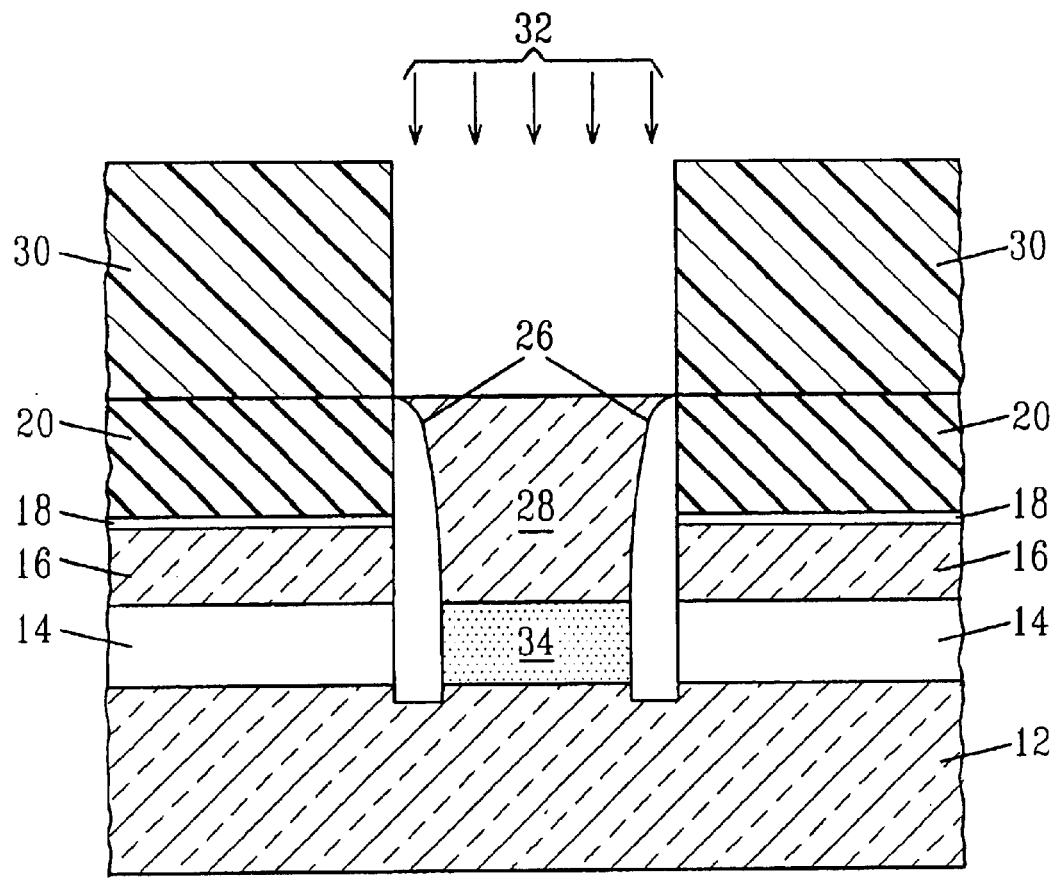
FIG. 5 is a pictorial representation (through a cross sectional view) illustrating the implantation of ions into the semiconductor material using an optional extra masking layer.

At this point of the present invention, an optional patterned implant mask 30 may be formed on the exposed surfaces of the structure shown in FIG. 4. In such an embodiment, a layer of photoresist is first applied to the exposed surfaces of the structure and then lithography including resist exposure and development is used in providing the optional patterned implant mask 30. Note that the sidewalls of the optional patterned implant mask may extend slightly over the sidewalls of the opening provided in the previous etching step. FIG. 5 shows the resultant structure including optional patterned implant mask 30.

With or without optional implant mask 30, ions 32 such as oxygen or nitrogen, are implanted into the exposed portion of semiconductor material 28 so as to form an implant region 34 within the semiconductor material 28. See FIG. 5. The depth of the implant region 34 may be engineered so that an upper surface region of the buried insulating materials 36 after the annealing step in FIG. 6 (the final buried oxide top surface is substantially level with the upper surface of the insulating layer 14. Note that this implant region will be subsequently level with the upper surface region of the buried insulator 36 after the annealing step (see, FIG. 6). The implant region contains a high concentration of ions which are capable of forming a buried insulating layer during a subsequent high temperature annealing step. The ion implantation performed at this stage of the present invention may include various well-known ion implantation conditions, including for example, the following:

High-dose ion implantation: The term "high-dose" as used herein denotes an ion dosage of about 4E17 $cm^{-2}$ or greater, with an ion dosage of from about 4E17 to about 2E18 $cm^{-2}$ being more preferred. In addition to using high-dosage, this implant is typically carried out in an ion implantation apparatus at an energy of from about 10 to about 1000 keV. More preferably, this implant is carried out using an energy of from about 60 to about 250 keV.

This implant, which may be referred to as a base ion implant, is carried out at a temperature of from about 200° to about 800° C. at a beam current density of from about 0.05 to about 500 mA $cm^{-2}$. More preferably, the base ion implant may be carried out at a temperature of from about 200° to about 600° C. at a beam current density of from about 4 to about 8 mA $cm^{-2}$.

If desired, the base implant step may be followed by a second implant that is carried out using a dose of from about 1E14 to about 1E16 $cm^{-2}$, with a dose of from about 1E15 to about 4E15 $cm^{-2}$ being more highly preferred. The second implant is carried out at an energy of from about 40 keV or greater, with an energy of from about 120 to about 450 keV being more preferred.

This second implant is performed at a temperature of from about 4K to about 200° C. with a beam current density of from about 0.05 to about 10 mA $cm^{-2}$. More preferably, the second implant may be performed at a temperature of from about 25° to about 100° C. with a beam current density of from about 0.5 to about 5.0 mA $cm^{-2}$.

Note that the second implant forms an amorphous region below the damaged region caused by the base ion implant step. During the subsequent annealing, the amorphous and damaged regions are converted into a buried insulating region.

Low-dose implant: The term "low-dose" as used herein for this embodiment of the present invention denotes an ion dose of about 4E17 cm–2 or less, with an ion dose of from about 1E17 to about 3.9E17 $cm^{-2}$ being more preferred. This low-dose implant is performed at an energy of from about 40 to about 500 keV, with an implant energy of from about 60 to about 250 keV being more highly preferred.

This low-dose implant, which may be referred to as a base ion implant, is carried out at a temperature of from about 100° to about 800° C. More preferably, the base ion implant may be carried out at a temperature of from about 200° to about 650° C. The beam current density used in the low-dose implant is from about 0.05 to about 500 mA cm–2.

If desired, the base low-dose implant step may be followed by a second oxygen implant that is carried out using the conditions mentioned above.

It is again emphasized that the above types of ion implantations are exemplary and by no way limit the scope of the present invention. Instead, the present invention contemplates all conventional ion implants that are typical employed in conventional SIMOX processes.

After ion implantation, the optional patterned mask 30 is typically removed from the structure utilizing a conventional resist stripping process well-known to those skilled in the art. Next, the structure including implant region 34 is subjected to a high temperature annealing process that is capable of converting the implant region 34 into a buried insulating 36 of high-quality. Specifically, the annealing step of the present invention is performed at a temperature of from about 700° to about 1400° C., with a temperature of from about 1100° to about 1300° C. being more highly preferred.

Moreover, the annealing step of the present invention is carried out in an oxidizing ambient. The oxidizing ambient used during the annealing step includes at least one oxygen-containing gas such as $O_2$, NO, $N_2O$, ozone, air as well as other like oxygen-containing gases. The oxygen-containing gas may be admixed with each other (such as an admixture of $O_2$ and NO), or the gas may be diluted with an inert gas such as He, Ar, $N_2$, Xe, Kr, or Ne.

The annealing step may be carried out for a variable period of time, which typically ranges from about 1 to about 100 hours, with a time period of from about 2 to about 24 hours being more highly preferred. The annealing step may be carried out at a single targeted temperature, or various ramp and soak cycles using various ramp rates and soak times can be employed.

Because the annealing is performed in an oxidizing ambient, an upper portion of semiconductor material 28 oxidizes forming a surface oxide region 38 in the semiconductor material 28. Note that oxidation of the top semiconductor layer 16 is prevented by the presence of the patterned mask 20. The surface oxide region 38 has a volume almost twice of silicon before oxidation.

Figure 6:
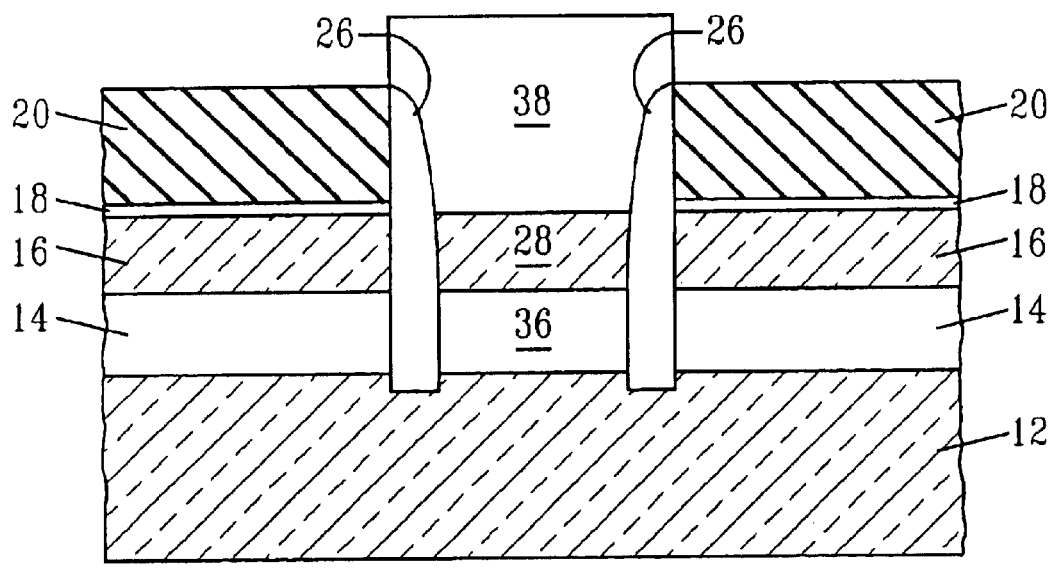
FIG. 6 is a pictorial representation (through a cross sectional view) illustrating the structure formed after annealing the structure shown in FIG. 5.
Figure 7:
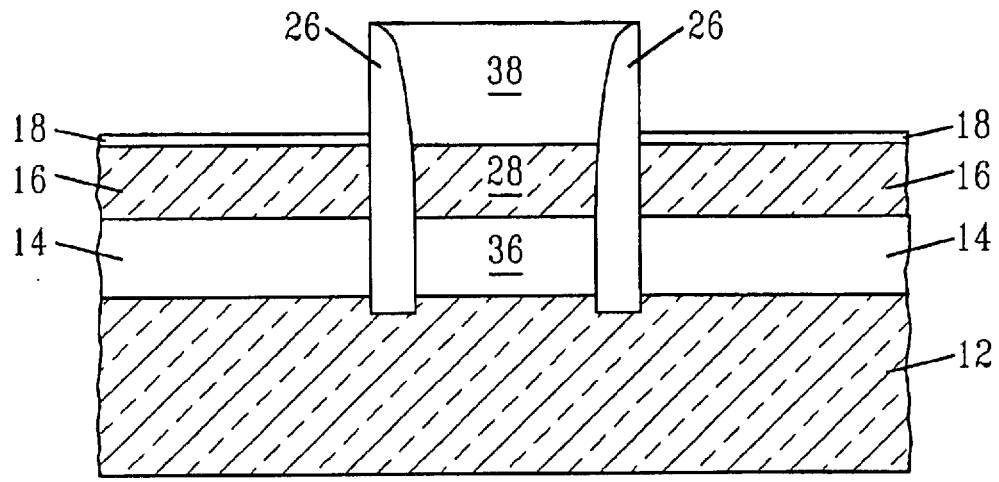
FIG. 7 is a pictorial representation (through a cross sectional view) illustrating the structure after the patterned mask has been removed from the semiconductor material.

Next, the patterned mask 20 is selectively removed from the structure shown in FIG. 6 stopping on the surface dielectric 18. The patterned mask 20 is removed in the present invention by utilizing a wet chemical etching process wherein an etchant such as, for example, hot phosphoric acid, is used. Hot phosphoric acid is particularly useful when the patterned mask 20 is comprised of SiN since it etches SiN selective to oxide. The resultant structure formed after this etching step has been performed is shown, for example, in FIG. 7.

Figure 8:
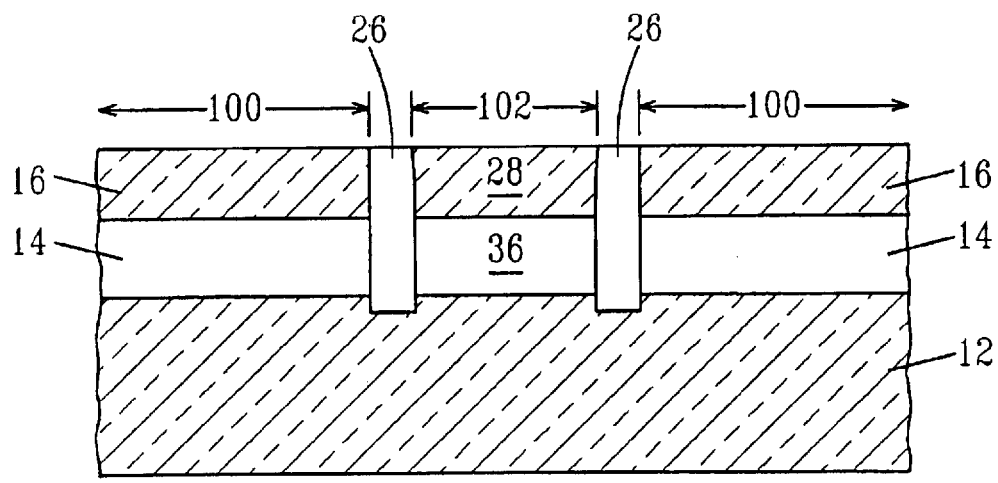
FIG. 8 is a pictorial representation (through a cross sectional view) illustrating the structure that is formed after planarization.

Referring now to FIG. 8, the surface oxide 38, i.e., oxidized region of the regrown semiconductor material, along with the surface dielectric 18 and optionally, a portion of spacer 26 are removed selective to the semiconductor material. This step of the present invention may be referred to as a planarization process since it provides the planar structure shown in FIG. 8.

Specifically, a wet chemical etching process that selectively removes oxide as compared to semiconductor material may be employed in the present invention. An example of an etchant that can be used at this point of the present invention to selectively remove oxide is buffered HF. The spacer 26 above the SOI layers, i.e., top semiconductor layer 16 and semiconductor material 28, may also be removed. Because the spacer 26 is typically located in the isolation region (instead of the active device region), recess or removal of the spacer is acceptable. The removed spacer can be replaced or corrected during the formation of trench isolation regions.

Note that in FIG. 8, a first device region labeled as 100 and a second device region labeled as 102 are shown. The first device region includes the top semiconductor layer 16, while the second device region 102 includes the regrown semiconductor material 28. Both active areas are SOI areas since an insulating region separates the active areas from the bottom semiconductor layer 12. As illustrated, the structure of FIG. 8 contains the regrown semiconductor material 28 having a second crystallographic orientation which is substantially coplanar and of substantially the same thickness as that of the top semiconductor layer 16 that has the first crystallographic orientation which differs from the second.

After providing the substantially planar surfaces, an isolation region 40, such as a shallow trench isolation region, is typically formed so as to isolate the first semiconductor device region 100 from the second semiconductor device region 102. The isolation region 40 is formed in the region in which the spacers are present utilizing processing steps that are well-known to those skilled in the art including, for example, trench definition and etching; optionally lining the trench with a diffusion barrier; and filling the trench with a trench dielectric such as an oxide. After the trench fill, the structure may be planarized and an optional densification process step may be performed to densify the trench dielectric.

Figure 9:
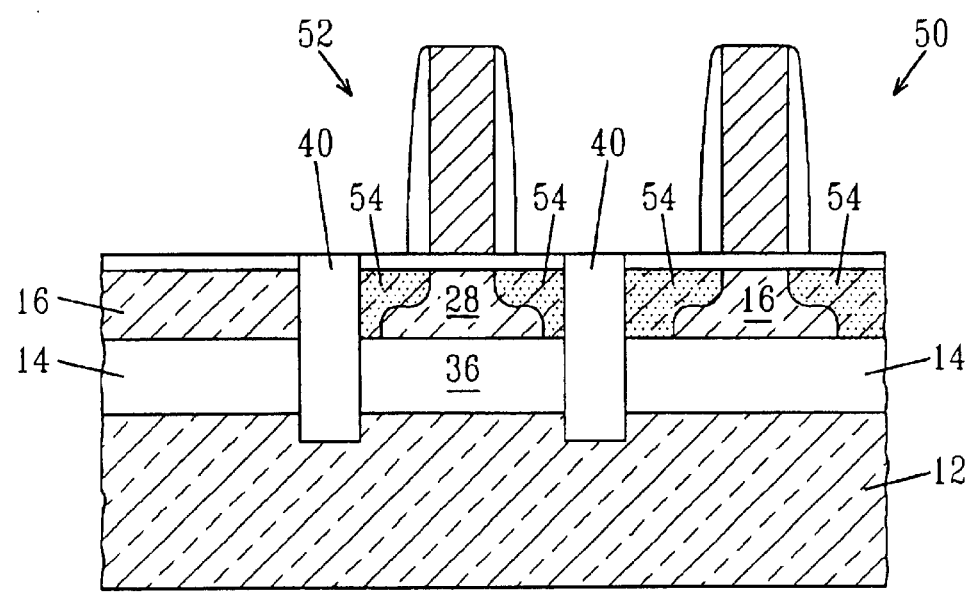
FIG. 9 is a pictorial representation (through a cross sectional view) illustrating the integrated semiconductor structure of the present invention containing an nFET and a pFET formed on a coplanar surface of different crystallographic orientations, but with substantially the same SOI thickness.

The resultant substantially planar structure containing isolation region 40 is shown, for example, in FIG. 9. This drawing also shows the integrated structure that is formed after a first semiconductor device 50 is formed on a portion of the first semiconductor layer 16 and a second semiconductor device 52 is formed on the regrown semiconductor material 28. Despite showing the presence of only one semiconductor device in each device region, the present invention contemplates forming a plurality of each type of device in the specific device region.

In other embodiments of the present invention, the isolation region 40 is formed inside regions 100 and 102 shown in FIG. 8 so that many pFETs or nFETs can be fabricated in each region originally separated by spacers 26.

In accordance with the present invention, the first semiconductor device may be a pFET or an nFET, whereas the second semiconductor device may be an nFET or pFET, with the proviso that the first semiconductor device is different from the second semiconductor device and that the specific device is fabricating on a crystal orientation that provides a high performance device. The pFETs and nFETs are formed utilizing standard CMOS processing steps that are well-known to those skilled in the art. Each FET includes a gate dielectric, a gate conductor, an optional hard mask located atop the gate conductor, spacers located on sidewalls of at least the gate conductor, and diffusion regions. The diffusion regions are labeled as 54 in FIG. 9.

Note that the pFET is formed over the semiconductor material that has a (110), or (111) orientation, whereas the nFET is formed over a semiconductor surface having a (100), or (111) orientation.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming an integrated semiconductor structure comprising:

provoding an SOI substrate comprising a top semiconductor layer of a first crystallographic orientation and a bottom semiconductor layer of a second crystallographic orientation separated by an insulating layer, said first crystallographic orientation is different from said second crystallographic orientation;

forming at least one opening in the SOI substrate that exposes a surface of the bottom semiconductor layer;

growing a semiconductor material on said exposed surface of the bottom semiconductor layer, said semiconductor material having a crystallographic orientation that is the same as the second crystallographic orientation;

forming a buried insulating region in said semiconductor material by ion implantation and annealing, said buried insulating region separates the semiconductor material from said bottom semiconductor layer; and planarizing the implanted semiconductor material to provide a structure in which the semiconductor material having the second crystallographic orientation is substantially coplanar and of substantially the same thickness as that of the top semiconductor layer.

2. The method of claim 1 wherein the providing the SOI substrate comprises bonding two wafers together, wherein at least one wafer includes the top semiconductor layer and the other wafer includes the bottom semiconductor layer.

3. The method of claim 1 wherein said SOI substrate further includes a surface dielectric formed thereon.

4. The method of claim 1 wherein said forming at least one opening comprising forming a patterned mask on the SOT substrate and etching.

5. The method of claim 1 further comprising forming a spacer on exposed sidewalls of the least one opening prior to said growing the semiconductor material.

6. The method of claim 5 wherein said spacer is formed by deposition and etching.

7. The method of claim 1 wherein the growing the semiconductor material comprises a selective epitaxial growth process.

8. The method of claim 1 wherein the ion implantation comprises implanting oxygen or nitrogen ions within the semiconductor material.

9. The method of claim 1 wherein the ion implantation comprises a base ion implant step.

10. The method of claim 9 further comprising a second ion implantation step after the base ion implant step.

11. The method of claim 1 wherein the annealing is performed at a temperature of from about 700° to about 1400° C. in an oxidizing ambient.

12. The method of claim 1 wherein the oxidizing ambient includes an oxygen-containing gas that may optionally be diluted with an inert gas.

13. The method of claim 1 wherein said planarizing includes at least one etching step in which oxide is selectively removed.

14. The method of claim 1 further comprising forming at least one pFET and a least one nFET on said structure.

15. The method of claim 14 wherein the at least one pFET is located on a (110) crystallographic surface, while the at least one nFET is located on a (100) crystallographic surface.

16. The method of claim 1 wherein the top semiconductor layer has a (110) surface orientation and the semiconductor material has a (100) surface orientation.

17. The method of claim 16 further comprising forming at least one pFET on the (110) surface and at least one nFET the (100) surface.

* * * * *

UNITED STATES PATENT AND TRADEMARK OFFICE
CERTIFICATE OF CORRECTION

PATENT NO. : 6,830,962 B1
DATED : December 14, 2004
INVENTOR(S) : Kathryn W. Guarini et al.

Page 1 of 1

It is certified that error appears in the above-identified patent and that said Letters Patent is hereby corrected as shown below:

Title page,
Item [56], References Cited, U.S. PATENT DOCUMENTS,
"5,572,771 A 11/1996 Kelleghan………………..24/170" should be deleted
OTHER PUBLICATIONS,
"Bison Designs, On-Line Store, Hydro Clip, water bottle holder sold by applicant/owner before Aug. 2002. Bison Designs, On-Line Store, Bottle Bandit, water bottle holder sold by applicant/owner before Aug. 2002." should be deleted Signed and Sealed this Nineteenth Day of July, 2005

JON W. DUDAS
*Director of the United States Patent and Trademark Office*